US012798956B2

(12) United States Patent
Bluecher et al.

(10) Patent No.: US 12,798,956 B2
(45) Date of Patent: *Nov. 17, 2026

(54) EXTREMAL MICROSTRUCTURED SURFACES

(71) Applicant: BVW Invest AG, Steinhausen (CH)

(72) Inventors: Lukas Bluecher, Eurasberg (DE); Michael Milbocker, Holliston, MA (US)

( * ) Notice: Subject to any disclaimer, the term of this patent is extended or adjusted under 35 U.S.C. 154(b) by 211 days.

This patent is subject to a terminal disclaimer.

(21) Appl. No.: 18/766,331

(22) Filed: Jul. 8, 2024

(65) Prior Publication Data

US 2025/0091856 A1 Mar. 20, 2025

Related U.S. Application Data

(63) Continuation of application No. 16/676,293, filed on Nov. 6, 2019, now Pat. No. 12,060,261.

(51) Int. Cl.
*B81B 1/00* (2006.01)

(52) U.S. Cl.
CPC ........ *B81B 1/002* (2013.01); *B81B 2201/058* (2013.01); *B81B 2203/0307* (2013.01); *B81B 2203/0353* (2013.01); *B81B 2203/0361* (2013.01)

(58) Field of Classification Search
CPC ....... B81B 1/00; B81B 1/002; B81B 2203/03; B81B 2203/0307; B81B 2203/0353; B81B 2203/0361
See application file for complete search history.

(56) References Cited

U.S. PATENT DOCUMENTS

| | | | | |
|---|---|---|---|---|
| 12,060,261 | B2 | 8/2024 | Bluecher et al. | |
| 2017/0014111 | A1* | 1/2017 | Hulseman | A61B 17/00 |
| 2019/0117849 | A1 | 4/2019 | Bluecher et al. | |

FOREIGN PATENT DOCUMENTS

| | | | |
|---|---|---|---|
| WO | 2019089960 | A1 | 5/2019 |

* cited by examiner

*Primary Examiner* — Zachary M Davis

(74) *Attorney, Agent, or Firm* — Patterson Intellectual Property Law, P.C.; Ryan D. Levy; Mark A. Kilgore

(57) ABSTRACT

The present application relates to multifunctional hierarchically microstructured surfaces and three-dimensional anchored interfacial domain structures. The multifunctional properties are extremal. In one aspect the microstructured surfaces may be super-adhesive. Examples of super-adhesive mechanisms may include gas trapping, fluid trapping, and solid wrinkle trapping. In another aspect the microstructured surfaces may be nearly adhesive-less. Examples of adhesive-less mechanisms may include inter-solid surface lubrication, energy conserving fluid flows, and super-low drag phase-phase lateral displacement. The extremal structures may be obtained by anchoring mechanisms. Examples of anchoring mechanisms may include Wenzel-Cassie formation, contact angle confusion, and capillary effects.

11 Claims, 11 Drawing Sheets

EXTREMAL MICROSTRUCTURED SURFACES

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: U.S. patent application Ser. No. 16/676,293 filed on Nov. 6, 2019

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND SUMMARY

The present disclosure relates generally to devices that may include extremal microstructured surfaces that result in super-slippery or super-adhesive interactions between the device and a target surface.

More particularly, this disclosure pertains to multifunctional hierarchical microstructures and three-dimensional anchored interfacial domain structures that result in super-slippery and super-adhesive devices.

Transformation of kinetic energy to thermal energy due to micro-scale inter-surface deformation is a general definition of friction. Friction, in this sense, may be highly destructive to a target surface. Devices that use friction which result in destruction of the target surface may be avoided by providing devices which use inter-surface anchoring to provide both super-high and super-low adhesive devices. These devices may not affect the structural integrity of the target surface. Frictional effects may therefore be minimized in the present embodiments.

The term "inter-surface adhesion" is preferred because it is not limited to lateral translational motion (sliding), while the term "friction" is limited to lateral translational motion. Inter-surface adhesion applies to both lateral translational motion (sliding) and normal translation (peeling).

It is known in the art that organic thin films are now used to control surface adhesion. These organic films may form self-assembled monolayers (SAMs). SAM films have been shown to reduce the friction between two surfaces by changing the energy of the surface. SAMs may prevent a fluid such as water from wetting a surface. However, this research has not been extended to microstructured surfaces.

Several studies have been conducted on the adhesive properties of SAMs. These studies have shown that the adhesive properties depend on the structure and composition of the SAM. Most of these studies used Atomic Force Microscopy (AFM) to measure surface energy.

Surface energy variation is measured by passing the AFM probe tip over a surface comprising regions of SAM and the absence of SAM. The surface energy variation of the surface is measured by the AFM as the translational force on the probe varies as the normal force exerted by the probe is varied. It is generally known that longer-chain SAMs produce surfaces with lower surface energy. Longer chain molecules typically form films that are more densely packed and more crystalline in structure than shorter chain molecules typically form. The enhanced crystalline structure and better packing provide a lower energy surface.

Microstructured surface energy gradients are ideally suited for controlling spatio-temporal interfacial waves. While regular microstructured arrays have empirically revealed new and surprising phenomena concerning microfluidics (temporal) and "micro-interfaces" (spatial), microstructured gradients are more natural and may offer more potential.

Another design feature, which is commonly found in nature, and provides a three-dimensional gradient aspect, but is largely absent in the scientific literature, is the hierarchical arrangement of microstructure. Engineers are conditioned to think of waves as two-dimensional surface-like objects. Hierarchical arrangement of microstructure transcends intuitive limitations and provides a means for realizing three-dimensional spatially varying interfacial phase structures and associated interfacial energy domains. Indeed, in general, most interfacial geometries may only be completely understood in a four-dimensional context, where time is a real and quantifiable dimension. The temporal dimension is implicit in hierarchical microstructures.

Furthermore, these interfacial phase structures may have a self-assembly aspect. For example, a first hierarchical feature that traps a gas phase may facilitate the trapping of a liquid phase at a different hierarchical level. Surface tension between phase boundaries may play an important role. Hierarchical effects include lubricious penetration, the formation of capillary forces, and the formation of Van der Waals forces. When water is involved, hydrogen bonding may play an important role.

As disclosed herein, a surface with hierarchical microstructure design that can generate both super-slippery and super-adhesive characteristics while minimizing damage caused by friction may be advantageous.

BRIEF SUMMARY

This disclosure includes the description of one embodiment including a device having a microstructure surface which may include a first surface having a first and second distinct region. The first distinct region may include a first microstructure having a first surface energy, and the second distinct region may include a second microstructure having a second surface energy.

The first and second distinct regions may be configured to contact a target surface which may have a liquid disposed thereon. Upon contact, an interface region between at least the first surface or second surface and the target surface may be formed and at least one spatially varying energy gradient may develop in the interface region.

In some embodiments, the device may include at least one of the first microstructure or the second microstructure being configured to develop at least one Wenzel-Cassie domain when in contact with the liquid.

In some embodiments, the at least one Wenzel-Cassie domain and the at least one spatially varying energy gradient may develop contact angle confusion when the device is shear translated with respect to the target surface.

In some embodiments, at least one of the first microstructure or the second microstructure is configured to develop a spatially varying surface energy gradient by capillary action. The first microstructure or the second microstructure may be configured to develop Schallamach wave trapping. The first surface may further comprise a surfactant disposed thereon, and the spatially varying energy gradient may be developed at least in part by the surfactant.

In some embodiments, a device may have a microstructure surface that includes a first surface having at least a first distinct region and a second distinct region. The first distinct region may include a first microstructure having a first surface energy, and the second distinct region may include a second microstructure having a second surface energy.

The first and second distinct regions may be configured to contact a target surface. The target surface may have a liquid disposed thereon such that upon contact at least one interface region between at least the first surface or second surface and the target surface is formed and at least one spatially varying energy gradient develops in the interface region. The at least one interface region may include at least two regions selected from the group comprising: i) a Wenzel-Cassie region; ii) a Schallamach trapping region; iii) a contact angle confusion region; and iv) an anchoring region.

In some embodiments, the anchoring region may be developed by at least one anchoring mechanism such as capillary action, Wenzel-Cassie formation, or a surfactant-generated surface energy gradient.

In some embodiments, the anchoring region may be developed from opposing two of the anchoring mechanisms listed above.

In some embodiments, the first microstructure may comprise a plurality of hierarchical pillars and the second microstructure may comprise a plurality of capillary pillars. Each pillar of the plurality of hierarchical pillars may include a first pillar and a second pillar wherein the second pillars are disposed about the first pillars and the second pillars include a surface with vertically oriented radial fins. Each pillar of the plurality of capillary pillars may include a vertically tapered hole disposed about the central cross-section of the pillar wherein the hole may have a circular cross-section, the cross-section being larger at the top of the hole than the bottom, the vertically tapered hole including vertically oriented radial fins defining an interior surface of the hole which develops a surface energy gradient that increases from the top of the hole to the bottom of the hole.

In some embodiments, at least one of the plurality of the capillary pillars may include a through-hole communicated with the vertically tapered hole.

In some embodiments, the first microstructure may comprise a plurality of hierarchical pillars and the second microstructure may comprise a plurality of micro rails. Each pillar of the plurality of hierarchical pillars may include a first pillar, a second pillar, and a third pillar wherein the second pillars are disposed about the first pillars and the third pillars are disposed about the second pillars. The second and third pillars may be tapered with a larger circumference at the base of the pillar and a smaller circumference at the top of the pillar, the second and third pillar may include a surface with vertically oriented radial fins. The plurality of micro rails may be parallel to each other but having a decreasing distance between each successive micro rail in the direction opposite of a slippage direction of the device.

In some embodiments, the first microstructure may comprise a plurality of hierarchical pillars and the second microstructure may comprise a plurality of micro rails. Each pillar of the plurality of hierarchical pillars may include a first pillar and a second pillar wherein the second pillars may be disposed about the first pillars and the first pillars include a surface with vertically oriented radial fins. The plurality of micro rails may be convergent in opposing directions.

In some embodiments, the first microstructure may comprise a plurality of hierarchical micro rails and pillars including a first micro rail, a second micro rail disposed about the first micro rail, and a pillar disposed about the second micro rail. The first micro rail may further include a surface with bifurcating fins.

The first microstructure may comprise a plurality of hierarchical pillars disposed about a sinusoidal surface, each pillar of the hierarchical pillars may include a first pillar disposed about the second pillar, the second pillar may be equally spaced apart on the sinusoidal surface and the first pillar including vertically-oriented radial fins.

In some embodiments, the first microstructure may comprise a plurality of hierarchical pillars disposed about a sinusoidal surface. Each pillar of the hierarchical pillars may include a second pillar with vertically oriented radial fins and a first pillar disposed about the second pillar. The second pillar may be equally spaced apart on the sinusoidal surface and wherein the sinusoidal surface may be configured such that the distance between the sinusoidal peaks is one half the wavelength of a peristaltic wave of the target layer.

In some embodiments, the first microstructure may comprise a plurality of hierarchical micro rails and pillars including a first micro rail, a plurality of hierarchical pillars disposed about the first micro rail, the plurality of hierarchical pillars may include a first pillar having vertically-oriented radial fins, the first pillar disposed about a second pillar. The target surface may also include a plurality of micro rails which are configured to be complementary to the first microstructures.

DETAILED DESCRIPTION

Figure 1:
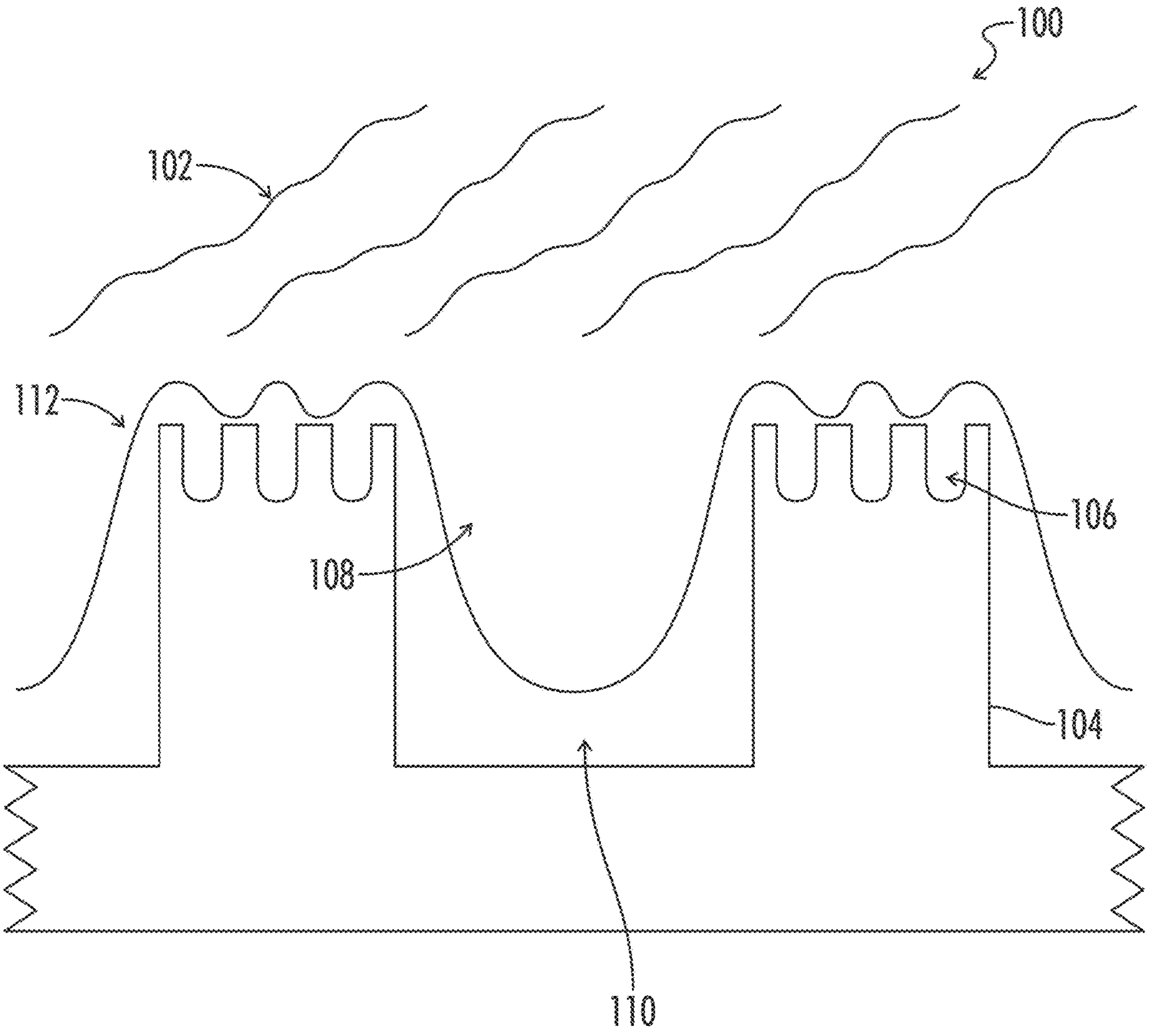
FIG. 1 is an embodiment of a fluid-trapping, super-slippery embodiment of the present disclosure.

Reference will now be made in detail to the embodiments of the present disclosure, one or more examples of which are set forth herein below. Each embodiment and example is provided by way of explanation of the device, composition, and materials of the present disclosure and is not a limitation. Rather, the following description provides a convenient illustration for implementing exemplary embodiments of the disclosure. In fact, it will be apparent to those skilled in the art that various modifications and variations can be made to the teachings of the present disclosure without departing from the scope or spirit of the disclosure. For instance, features illustrated or described as part of one embodiment, can be used with another embodiment to yield a still further embodiment. Thus, it is intended that the present disclosure covers such modifications and variations as come within the scope of the appended claims and their equivalents. Other objects, features, and aspects of the present disclosure are disclosed in or are obvious from the following detailed description. It is to be understood by one of ordinary skill in the art that the present discussion is a description of exemplary embodiments only and is not intended as limiting the broader aspects of the present disclosure.

As used herein the term "Schallamach wave" is used to denote a sliding aspect between two solid elastomeric surfaces wherein a stationary regime emerges wherein the resistance to shear translation is the result of competition between adhesive infinitesimal dragging and a continuous relaxation process. The relaxation process may occur in either of the two surfaces, wherein an elastic instability occurs. The elastic instability is associated with wave formation that evolves into buckling, wherein the elastic energy stored in the formed waves is suddenly released.

Also, as used herein the term "structured water" refers to a distribution of water molecules at the interface with a microstructured surface that is different from the bulk configuration of the same water. Water molecules are polar and self-assemble to minimize the energy of an interfacial surface. There are several types of structured water that have been hypothesized or observed in experiment. When this "structure" occurs, there may be thermodynamic and energetic changes that occur that may be used to exclude other molecules in the structured region, and even larger objects, e.g., cells, particulates, oil globules. For complicated microstructured interfaces, zones of structured water can be anchoring or repulsive, depending on the larger environment surrounding these zones of structured water.

As utilized herein, the term "hierarchical microstructure" may be used to describe three-dimensional plastic webs, matrices of protrusions, porosities, and any surface with geometrical modification which has been caused to conform to the surface of a three-dimensional forming structure so that both surfaces thereof exhibit the three-dimensional pattern of the forming structure, the pattern not readily visible to a normal human eye when the perpendicular distance between the viewer's eye and the plane of the microstructure is about 12 inches.

Interfacial structures that result in super-slip or super-adhesive conditions are at least one subject of the application disclosed herein. Devices that may utilize the first and second spatial and temporal derivatives of the interfacial free energy to achieve super-high and super-low adhesive devices, either separately or in combination may be disclosed. These derivatives may typically be described as surface energy gradients in the scientific literature. These surface energy gradients can be continuous or discrete. It is an object of the present application to provide devices that utilize both continuous and discrete surface energy gradients.

It should be appreciated that the terms "continuous" and "discrete" may be situationally dependent. The surface microstructures of the present disclosure may functionally act continuously with respect to macroscopic objects and functionally act discretely with respect to microscopic objects, e.g., cells. While all microstructures present a discrete aspect by definition, by spatially alternating high surface energy (hydrophilic) regions with low surface energy (hydrophobic) regions a stationary spatial surface energy wave results, which may be described in some situations as continuous.

In interfacial situations, there may be defined a set of spatial rhythms, some of which may provide minimal surface adhesion and others which may provide maximal surface adhesion. In the case of the Schallamach phenomenon, the rhythms may be both spatial and temporal. Accordingly, under conditions of controlled translation, spatial waves may become temporal waves. Furthermore, using effects such as electrowetting, it may be possible to control the temporal aspects digitally.

These rhythmic aspects, either spatial or temporal, utilized in practical applications, are at least one of the objects of the present disclosure. The relational or relativistic aspects may contribute to spatio-temporal rhythm in interfacial situations, and any absolute definitions of terms such as hydrophilicity and hydrophobicity, whose meanings are both scale and environmentally dependent, are not preferred. Likewise, the term contact angle is both spatially and temporally dependent.

Microstructured surface energy gradients may be ideally suited for controlling spatio-temporal interfacial waves. While regular microstructured arrays have empirically revealed new and surprising phenomena concerning microfluidics (temporal) and "micro-interfaces" (spatial), microstructured gradients may be more natural and may offer more potential.

It should be appreciated that the wave formation is a characteristic of the elastic eigen modes of the buckling material of the deformed surface. When a microstructure surface has a spatial periodicity that matches one of the eigen modes of an induced Schallamach wave, then the Schallamach wave may be entrapped and the relaxation process may be extinguished and sliding stops. This is considered the super-adhesive case. In the super-slip case, where the periodicity of the microstructured surface is a half-wavelength of an induced Schallamach wave, the Schallamach wave is continuously translated through the surface interface volume with minimal energy loss. This general behavior is described as a slip-grip dynamic, in which in one case the grip geometry is fixed, and in the other case the slip geometry is fixed.

The microstructured surfaces of the present disclosure may be formed by causing an irreversibly deformable material to conform to the surface of structures by embossing (i.e., when the structure exhibits a pattern comprised primarily of male projections), by debossing (i.e., when the structure exhibits a pattern comprised primarily of female capillary networks), or by extrusion of a resinous melt onto the surface of a structure of either type. By way of contrast, the term "planar" may be used to refer to the overall general macroscopic geometry of the surface when viewed by the naked eye.

Useful polymers for fabricating microstructured devices of the present invention include, but are not limited to: PDMS, PMMA, PTFE, polyurethanes, Teflon, Nylon, polyacrylates, thermoplastics, thermoplastic elastomers, fluoropolymers, biodegradable polymers, polycarbonates, polyethylenes, polyimides, polypropylene, polystyrenes, polyvinyls, polyolefins, silicones, natural rubbers, synthetic rubbers, styrene butadiene rubber, and any combination of these.

One of the features of super-slippery microstructured surfaces is to use surface energy induced by bulk microstructure and/or the addition of a wetting coating, wherein the wetting coating may draw the water to the surface and the microstructure may trap the water, such that a liquid layer is maintained or trapped between the microstructured surface and the target surface. The surface coating may be hydrophilic or lipophilic, depending on the type of liquid to be trapped on the microstructured surface. Some surfactants may have the ability to trap both aqueous solutions and oil solutions.

It should be obvious to one skilled in the art that surfactants are not only useful in creating super-slippery surfaces. When surfactants are used to maintain or establish a Wenzel-Cassie interface between the microstructured surface and the target surface, the microstructured surface may become super-adhesive in surprisingly non-intuitive situations. This aspect of having super-slippery properties and super-adhesive properties is referred to as "extremal."

Surfactants may be useful because they can be used to deliver fluid to an underlying capillary microstructure. Although untreated capillary microstructures are effective in transporting fluid, their effectiveness may be limited in that such capillary structures may only move fluid once liquid reaches the interior of the capillaries. Surfactants may bridge the gap between the target wet surface and the microstructured surface. Typically, the surfactant dissipates after serving its purpose, and now a layer of fluid may be pinned to the microstructured surface by its capillary microstructure.

FIG. 1 is an enlarged perspective illustration of a particularly preferred three-dimensional, fluid-trapping super-slippery embodiment of the present disclosure, generally indicated as 100. The geometrical configuration of the super-slippery microstructure surface 100 may include a surfactant web 102, pillars 104, and open holes 106. Fluid layer 108 may be trapped between pillars 104 at location 110, and fluid layer 108 may be anchored at the top regions 112 of the pillars at holes 106.

Figure 2:
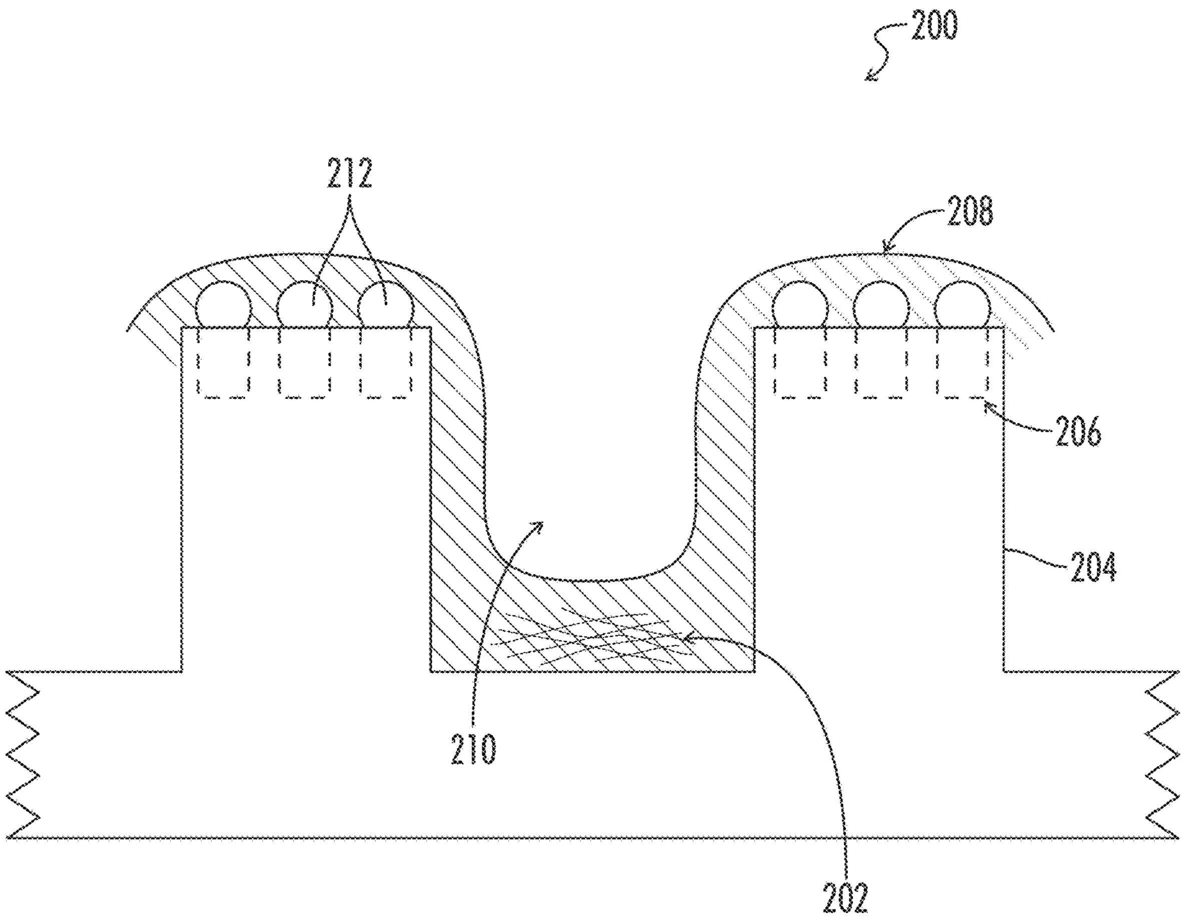
FIG. 2 is an embodiment of an alternative fluid-trapping, super-slippery embodiment of the present disclosure.

FIG. 2 is an enlarged perspective illustration of an alternative preferred three-dimensional, air-trapping super-slippery embodiment of the present disclosure, generally indicated as 200. The geometrical configuration of the super-slippery microstructure surface 200 includes surfactant web 202, pillars 204, and closed holes 206. Surfactant web 202 is disposed between pillars 204. Fluid layer 208 is drawn between pillars 204 at locations 210 and traps air bubbles 212 in closed holes 206. While the fluid layer 208 is trapped on microstructured surface 200, air bubbles 212 are also trapped. The combined biphasic layer of 200 may absorb Schallamach waves because the air bubbles 212 are compressible, whereas the fluid layer 208 is not. Therefore, for deformable target surfaces or deformable microstructured surfaces, microstructured surface 200 may be superior to microstructured surface 100.

In accordance with the present disclosure, microstructured surface 200 may comprise regions of different wettability. This difference in wettability, as exemplified by differences in surface energy between regions on the microstructure surface, may be defined herein as a "surface energy gradient." Surfaces with surface energy gradients may be more anchoring, whether the anchoring be the entrapment of a fluid biphasic layer to create a surface which is super-slippery or whether the anchoring be the target surface to create a surface which is super-adhesive.

When a surface can be characterized by a single average surface energy then that energy may be quantified by contact angle. The contact angle depends on surface heterogeneities (e.g., chemical and physical properties, such as roughness), contamination, chemical/physical treatment of or composition of the solid surface, as well as the nature of the liquid and its contamination.

As the surface energy of a solid surface decreases, the contact angle increases. As the surface energy of the solid increases, the contact angle decreases. When the surface energy changes across the surface of a microstructured surface the contact angle may also change. When there are microscopic regions on the microstructured surface that have different contact angles, these different regions may attract different constituents of a compound fluid at the interfacial layer. These different components of the compound liquid interfacial layer may be anchored at different but adjacent microscopic regions on the microstructured surface. Since the two components require energy input to mix, the two components may form a locking structure called a Wenzel-Cassie interface.

When the surface energy varies macroscopically, with or without microscopic variations, and when the microstructured layer is displaced with respect to the target surface, the contact angle may change globally in different respects at different microscopic regions. This phenomenon is called contact angle confusion. There may be an energy cost to transform the contact angle in these microscopic regions, which also serves to create a locking structure.

As already mentioned, these locking structures may be used to anchor a fluid interface in which case the target surface easily slips across the microstructured surface, or in the alternative, the locking structure may be used to anchor the target surface in which case the target surface slips across the microstructure surface with difficulty, or in other words, the interface may be adhesive.

The same patterns as previously disclosed may not only affect shear translation, but also may affect orthogonal translation which may be quantified by peel force. Both of these forces may depend on the energy required to disrupt a liquid structure (shear) or separate a liquid structure (peel) from a solid surface. While these two energies may not typically be the same, the equations expressing these energies both depend on work of adhesion, surface tension, and contact angle.

Work of adhesion is a useful tool in understanding and quantifying the surface energy characteristics of a given surface. Another useful method which could be utilized to characterize the surface energy characteristics of a given surface is the critical surface tension. It should be appreciated that surface energy changes, both microscopic and macroscopic, under shear and peel forces, may characterize super-slippery and super-adhesive surfaces.

In the context of the present disclosure, spatially varying surface energy (i.e., surface energy gradients) may be useful in maintaining an interface structure, either the super-slippery type or the super-adhesive type.

Figure 3:
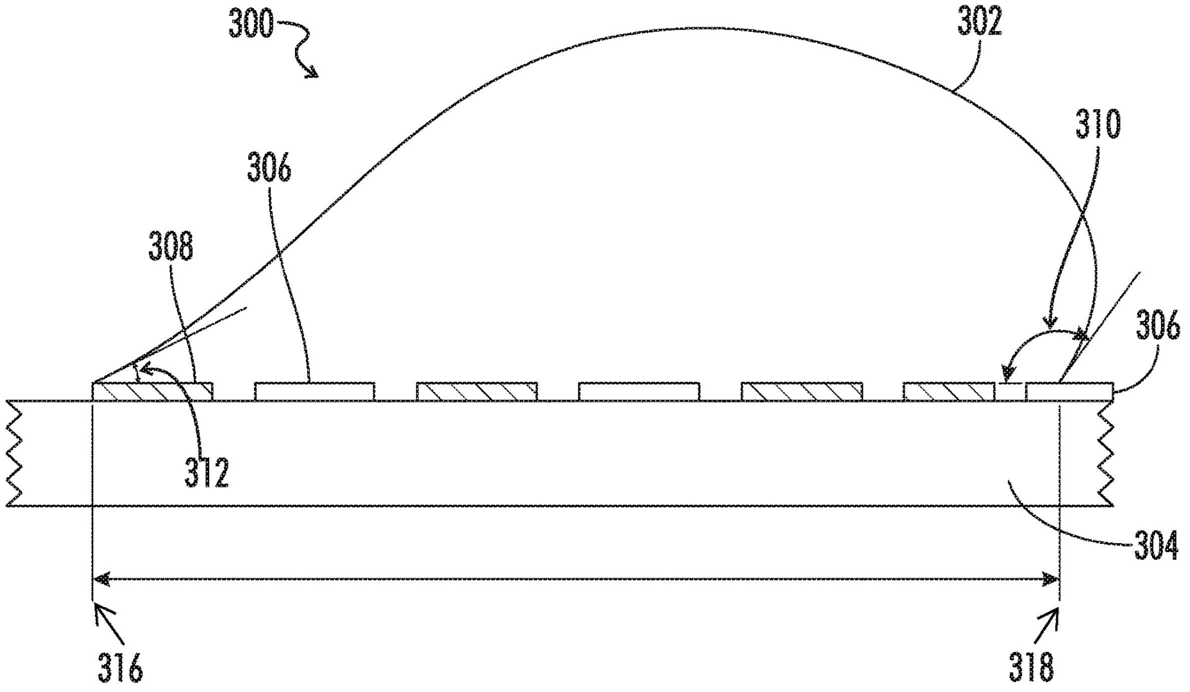
FIG. 3 is an embodiment of a surface gradient on a microstructured surface.

FIG. 3 illustrates a surface gradient on a microstructure surface 300 and a droplet of fluid 302 which is located on a solid microstructured surface 304 having two regions 306, 308 which may comprise differing surface energies (indicated by the different cross-hatching for illustrative purposes). In the embodiment of FIG. 3, the first region 306 may exhibit a comparatively lower surface energy to the second region 308, and hence a reduced wettability for the droplet fluid for the first region than the second region. Accordingly, the droplet 302 may produce a contact angle 310 at the edge of the droplet contacting the first region 306 which is greater than the contact angle 312 produced at the edge of the droplet contacting the second region 308. It should be noted that although for graphic clarity the points defining the two contact angles lie in a plane, the distance 314 between points 316 and 318 need not be linear, instead representing the extent of droplet/surface contact regardless of the shape of the surface. Droplet 302 thus may experience a surface energy imbalance and hence an external force due to the differences in the relative surface energies (i.e., the surface energy gradient) between differing regions 306 and 308. The differential in surface energy between the two surfaces may be useful in anchoring, where complex fluids disaggregate into droplets of different composition, which then may lead to droplets where the surface energy imbalances results in force vectors that are opposed.

The force experienced by a droplet may cause movement (a force vector) in the direction of the higher surface energy. In the case of hierarchical microstructured surfaces of the present disclosure, the surface energy gradient may be characterized as a gradual change in the macroscopic level and a sharp discontinuity or boundary between well-defined regions of constant but differing surface energy in the microscopic level. Surface energy gradients may also be generated in a stepwise gradient, with the force exerted on any particular droplet (or portions of a liquid interface) being determined by the surface energy at each particular microscopic area of interfacial contact.

In addition to the presence of surface energy gradients, the orientation, location and/or sizes of microstructure features and their various compositions may also be considered. Generic geometric forms comprising features of differing sizes stacked upon one another in distinct layers to form a hierarchical microstructured surface may be utilized.

Differing surface energies residing in regions arranged in hierarchies on a microstructured surface may be enhanced when their orientation and distribution coincides with the orientation and location of capillaries or fluid passageways. In some embodiments, it may be beneficial to induce a fluid flow in an interface to create a suction effect between two surfaces. In other cases, it may be beneficial to induce a fluid flow to drain fluid from a fluid eluting surface so that anchoring structures may be maintained, whether the anchoring structure produces a lubricious effect or an adhesive effect.

More particularly, in certain embodiments materials with a relatively low surface energy may be disposed in relation to capillaries such that fluid deposited on a first or upper surface may contact at least one region having a relatively low surface energy and thus experience a driving force accompanied with a surface energy gradient.

For example, in one embodiment regions possessing a relatively low surface energy are preferentially disposed on a first hierarchical level of a microstructured surface of the present disclosure. The underlying hierarchical level may possess a higher surface energy, such that the first hierarchical level also creates a capillary effect in the direction orthogonal to the microstructured surface plane. If the capillary forces cooperate with the surface energy forces to reinforce their mutual action then these structures may be self-similar in at least one respect of feature height, width, lateral pitch (in-plane spatial frequency) and orthogonal pitch (out-plane spatial frequency). Global surface energy gradients may be especially created in a compound way. For instance, one surface energy gradient may be in the direction x and another in the direction y, wherein the xy-plane may comprise the microstructured plane. Further considerations may include arrangements of micro features reflecting distributions selected from the group of rectilinear, cylindrical, and spherical coordinates.

In some embodiments, the use of the discrete or continuous gradients, whether in a spatially constant aspect or in a spatially varying aspect may be applied. The discrete architecture may be fluid trapping, and the continuous architecture may be fluid driving, however either may also be employed to induce the other. For instance, a stepwise-discrete architecture may drive fluid flow in the form of quantizes volumes of fluid. A continuously varying sinusoidal profile of a microstructure hierarchical level may be employed to trap Schallamach waves.

In addition, there may be many subtle mechanisms of interface structure formation that are combinations of the principles outlined above. In one embodiment, a droplet may be located over and extend partially into the entrance of a capillary. The lower portion of the droplet may be within the capillary and form a meniscus, with the edges of the meniscus in contact with the capillary wall in one region having relatively low surface energy. The surface energy gradient between two adjacent surfaces may be selected to determine contact between the lower portion of the droplet in the vicinity of the edge of the meniscus. In such an embodiment, the orientation of the droplet and depth of the meniscus of the droplet may be determined by factors such as fluid viscosity, fluid surface tension, capillary size and shape, and the surface energy of the upper surface and capillary entrance. In some embodiments, the capillary may have a diameter of between 1 and 100 microns when the capillary is cylindrical. It should be understood however that capillary action may occur at all size scales.

When a droplet is positioned over a capillary entrance and the lower edge of the droplet is exposed to the surface energy gradient between two surfaces of different surface energy, the meniscus may become much more concave. When the meniscus produces a concave form, the fluid may wet the capillary wall in the vicinity of the upper region with a relatively high surface energy and the fluid may experience an external force due to the surface energy differential. In this way the combined surface energy differential force and the capillary pressure force may work together in the same direction to draw the fluid into the capillary and generate fluid transport away from the first surface. As the fluid droplet moves downward into the capillary, the comparatively low surface energy nature of the first surface at the upper region of the capillary maximizes the attraction of the fluid toward the lower surface. Such reinforcing anchoring mechanisms may reduce the frequency of fluid transport failure due to varying fluidic compositions or solids in the fluid resulting in capillary occlusion. Surface energy gradients may be used to remove particulate contaminates to the periphery of the interface volume, or to a sequestered region, so that the remaining surface area of the microstructure surface will operate as intended. For example, a reinforced anchoring mechanism may be used to remove serum from whole blood by sequestering red blood cells away from the fluid flow through regions of the interfacial volume.

Similarly, surface energy gradients may be used as fluid barriers, or as compound fluid separators within the confines of the interface volume. The energy cost of reducing the entropy of the fluid in the interfacial volume by separating fluid components, for example aqueous from lipids, may be balanced by the reduction of surface energy along the surface energy gradient. Hence, any displacement of the microstructured device with respect to the target surface may result in a remixing of the aqueous and lipid constituents, which may require energy input, and hence fluid barrier microstructures would tend to be anchoring.

In some embodiments, regularity in microstructure design may be a beneficial feature, if not required. However, in an environment where the target surface is not precisely known or the interfacial fluid composition is only approximately known, a degree of randomness in the microstructure design may be beneficial. For example, a microstructured surface comprised of repeating microstructures with a certain height, pitch, width, diameter, and the like, may be imagined, but any of these important design features may be mean values. Namely, the intended design function may be achieved by engineering into the microstructure certain parameters that are satisfied by the mean of each parameter. For example, the pitch, height, width, diameter, and the like may vary in either a periodic or random fashion such that a mean value of the relevant parameters is obtained. Such devices with a random distribution of parameter values at specific microscopic location may be robust in a wide range of environments. In some embodiments, the height may be from 1 to 250 microns, pitch from 10 to 100 microns, and a width of 3 to 100 microns.

Randomness may be incorporated across the entire microstructured surface design, including within hierarchical levels and between hierarchical levels. Some levels, for example a first target surface contacting level, may be populated with features of varying height within a prescribed range, mean, and standard deviation of heights. In the randomness between levels, one may prescribe certain correlations. Randomness in a first level may be either anti-correlated or positively correlated with a subsequent level. Variation in pitch in one level may be paired with variation in height in another level. Likewise, the geometric shape of micro features may be varied. For example, a cylinder cross section design may vary across a family of elliptical cross sections. In addition, variations in bulk material composition may be implemented, with or without correlation with the geometrical variation of microstructure features. Randomness may also be introduced from the perspective of continuous and discrete microstructures. The continuity or discreteness may itself be randomly discontinued in a spatial aspect, or a multiplicity of hierarchical levels may be randomly varied with respect to the discreteness or continuity.

In some embodiments the target surface and the upper surfaces of the microstructured surface may work together forming the boundaries of the interfacial volume where interfacial fluids may be energetically less favored to reside. In other embodiments, interfacial fluids may be trapped and act as a lubricious layer.

Regarding the use of a surfactant, the solubility of a surfactant or surfactant component residing on a microstructured surface may depend on the amount and type of the hydrophobic portion of the surfactant relative to the hydrophilic portion. For nonionic surfactant materials this relationship may be characterized in terms of the hydrophile-lipophile balance (HLB) where lower HLB values are more lipophilic. Thus, surfactants or surfactant components having the lowest HLB values may be more soluble in a nonpolar matrix and permeate faster. Surfactants that act as wetting agents may have HLB values in the range of about 7 to 9. As a result, the more soluble (low HLB) surfactants or surfactant components may not be as effective in increasing the wettability of a surface.

Diffusion is influenced by factors that include molecular size, molecular shape, and viscosity. For example, at a given HLB (similar solubility), a surfactant with a bulky hydrophile (e.g., a sorbitan ester) may diffuse more slowly than a surfactant with a more linear hydrophile (e.g. a fatty alcohol ethoxylate).

In some embodiments, a surfactant may be one wherein the surface depositions and the underlying polymeric structure may not be so wettable that any designed surface energy gradient is saturated or any Wenzel-Cassie interface structures are disrupted. One of skill would appreciate that certain concentrations of dissolved surfactant reinforce Wenzel-Cassie interface formation, while greater concentrations may disperse Wenzel-Cassie interface formation. Suitable surfactants for the present disclosure may include those that have a surface tension in water solution that is between the critical surface tension of the low surface energy surfaces and the bulk material.

Surfactants may shift the mean surface energy without changing the surface energy gradient. The gradient may result because of the different effect the surfactant has on the surfaces of different dimensional characteristics.

Acceptable surfactants may include, but are not limited to Atmer, Tergitol, Neodol, Ameroxol, Pegosperse, and the like, as available from ICI Surfactants of Wilmington, DE. Particularly preferred surfactant materials according to the present disclosure may have a hydrophobe that is substantially saturated.

Functionalized Surface Treatments

In many applications, surface texture may be replaced by surface treatments that may change the surface energy of the underlying material. Therefore, some embodiments may include surface microtextures, surface charge/energy modifications, or combinations of these. Some embodiments may include specific combinations of spatially distributed surface energies which achieve anchoring mechanisms. Anchoring mechanisms may include Schallamach wave entrainment, Wenzel-Cassie formation, and/or contact angle confusion. These anchoring mechanisms may be useful in achieving super-slip and super-grip microstructure surfaces under design parameters explicated in the present disclosure.

Self-assembling monolayer (SAM) films may be preferred in surface energy modification by material deposition only. Common polymers can be used, but SAMs can modify the surface energy of a surface significantly. Surface treatments have the advantage that they may be continuous down to the molecular scale. Continuous gradients of surface energy may be obtained by using a mixture of SAMs, where the mixture varies spatially.

Methods of derivatizing a solid surface with a mixed monolayer to create a surface energy gradient may comprise the following steps: a) exposing a base microstructure surface having a proximal free end and a distal anchored end, wherein the proximal surface is exposed to a first solution comprising a plurality of molecules of the formula X1-Y1-Z1, wherein X1 and Z1 represent separate functional groups and Y1 represents a spacer moiety that, together, are able to promote formation from solution of a self-assembled monolayer for sufficient time to form a monolayer surface having a substantially uniform surface energy on the base surface, b) removing a portion of the monolayer of step "a)" such that a portion of the proximal surface is again fully or partially exposed, c) exposing the portion of the proximal surface from "b)" to a second solution comprising a plurality of molecules of the formula X2-Y2-Z2 and a plurality of molecules of the formula X1-Y1-M1 wherein the functional group Z2 has a different surface energy from that of the functional group Z1 such that a surface energy gradient from a first coated location to a second coated location is formed on proximal surface.

One example of the steps in producing a representative mixed monolayer surface energy gradient may comprise first, a proximal surface of a microstructure which comprises a plurality of first organic molecules (X1), comprising either the molecules of the microstructure bulk or a treatment to the microstructure bulk molecules. These first organic molecules are reacted with a spacer group (Y1), e.g. thiol, isocyanate, amine, attached to a functional group (Z1), e.g. CH3, CF3, etc. The resulting sequence X1-Y1-Z1 attaches a low surface energy monolayer to said proximal surface. Second, an ablative instrument contacts the formed first monolayer. The ablative instrument comes into contact with the first monolayer and removes some of the original first monolayer as the instrument passes along the proximal surface. Alternatively, the spacer group may be a hydrolyzable or degradable group, e.g., lysine diisocyanate. Third, a second monolayer of organic molecules is added. The second organic molecules are comprised of a functional group designed to react with the base surface and a high surface energy functional group, e.g. OH, CO2H, CONH2, etc. Some of the second organic molecules react with the base surface and create a mixed SAM layer.

The addition of the second monolayer can occur concurrently with an ablative process such that the ablative instrument is continuously exposing the base surface. For example, the microstructure can be immersed in a solution, into which second organic molecules are added during a concurrent ablative process. The second molecules added to the solution continuously react with the concurrent exposure of the base surface. The result is a higher concentration of high energy groups comprising a mixed monolayer formed along the portion of the surface where the instrument passed, and a surface energy gradient is thus formed.

When modifying the proximal surfaces of hierarchical microstructures, an ablative instrument may be too cumbersome. Nanografting to specific microstructure locations can be accomplished using an Atomic Force Microscope (AFM) to remove a first monolayer. AFM instruments with a tip radius of 20-nm could be used. Other instruments such as those commonly used in micromachining applications can be used. Micromachining applications are capable of generating gradient channels with widths in the range of 100-1000 microns.

In an embodiment, in a first step the base surface is exposed to a toluene solution containing an octadecyltrichlorosilane (a first SAM surfactant solution) capable of forming a SAM on the surface. Five hours may be sufficient to create a modified surface coated with a SAM film that has a methyl (—CH3) tail group. This treatment may create a low-energy surface that repels water. Best results may be obtained when the process is performed under an inert atmosphere such as nitrogen although it can be carried out under normal atmospheric conditions as well.

The base comprising the first surface treatment may be placed in solution while an AFM tip passes over the surface and begins to remove parts of the first SAM treatment and expose the original base surface. At the same time the AFM begins to remove the original SAM film, drops of toluene solution containing an organic trichlorosilane surfactant with a high-energy tail group such as —CO2H can be added to the solution.

The first and second surfactants (one with the high energy tail group the other with the low energy tail group) may form a mixed SAM on the area where the instrument partially or entirely removed the previous SAM. The instrument may continue to move along the original surface and remove the first SAM while more of the CO2H-terminated surfactant is added to the solution. As the AFM passes along the surface, the concentration of CO2H-terminated surfactant may continually increase in the solution. As the percentage of CO2H-terminated surfactant in solution continually increases, the percentage of CO2H-groups may continually increase in the mixed monolayer that forms along the path of the AFM tip. The mixed SAM that forms may have a continuously increasing —CO2H concentration at the surface. Therefore, the surface energy may increase along the length of the channel.

The base material need not be a polymer. The base surfaces can be a metal oxide comprising a metal oxide from the group comprising silica, alumina, quartz, glass, or the like. In some embodiments using metal oxide base surfaces, the functional group X may be a carboxylic acid. The base surface may include gold, silver, copper, aluminum, cadmium, zinc, palladium, platinum, lead, iron, chromium, manganese, tungsten, and any alloys of the above, and solid alloys made with mercury.

In some embodiments using metals for the base surfaces, the functional group X may be a sulfur-containing functional group (e.g. thiols, sulfides, disulfides, and the like). In other embodiments, the metal of the base surface may be in the form of a metalized film coating a polymer surface. The base surface can be doped or undoped silicon. In some embodiments using doped or undoped silicon for the base surface, the functional group X may be selected from the group comprising silanes or chlorosilanes.

If the base surface is a metal selected from the group comprising palladium and platinum, the functional group X may be a functional group selected from the group comprising nitrites and isonitriles. If the base surface is copper, the functional group X may be a hydroxamic acid. If the base surface is gold, the functional group X may be at least one sulfur-containing functional group selected from the group consisting of thiols, sulfides, or disulfides.

The functional groups Z1, Z2, . . . . Zn may be selected from the group comprising ionic, nonionic, polar, nonpolar, halogenated, alkyl, aryl or other functionalities. For example, the functional groups Z1, Z2, . . . . Zn can include any of the following: —OH, —CONHR, —CONHCOR, —NHR, —COOH, —COOR, —CSNHR, —COR, —RCSR, —RSR, —ROR, —SOOR, —RSOR, —CONR2, (OCH2CH2)nOH, —(OCH2CH2)nOR—NR2, —CN, —(CF2)nCF3, —CO2CH3, —CONHCH3, —CR, CHCH2, —OCH2CF2CF3, Cl, Br, olefins, and the like, and any combination thereof.

In the above list, R may be hydrogen or an organic group such as a hydrocarbon or fluorinated hydrocarbon. As used herein, the term "hydrocarbon" includes alkyl, alkenyl, alkynyl, cycloalkyl, aryl, alkaryl, aralkyl, and the like. The hydrocarbon group may, for example, comprise methyl, propenyl, ethynyl, cyclohexyl, phenyl, tolyl, and benzyl groups. The term "fluorinated hydrocarbon" is meant to refer to fluorinated derivatives of the above-described hydrocarbon groups.

The group Y may be a hydrocarbon chain with the formula —(CH2)n— where n is between 1 and 22, preferably between 2 and 18, more preferably between 2 and 12.

Silicon oxide is a high-energy surface, water will wet it very easily, and energy loss due to adhesion may be high. The high-energy silicon oxide surface may be converted into a low-energy surface by depositing a SAM film on the silicon that will repel water and reduce adhesion. For example, a SAM obtained from an alkylsilane-based surfactant with a silane head group X and a methyl (—CH3) tail group Z. The silane head group may bond with the silicon, resulting in a SAM film with a —CH3 surface. The carbon chain backbone of the SAM should be a single chain and contain at least 6 carbons. This type of SAM may pack very closely, resulting in lower adhesion.

Generally, changing the tail group of a SAM from, for example, a —CH3 group to an —OH or —CO2H group, the surface may change from a low-energy surface to a high-energy surface. This ability to change the surface energy of a bulk substance by grafting to the bulk a molecular-scale tail group is self-similar to changing the surface energy of a bulk substance by embossing on a surface pattern. Just as the valence shells of atoms are stacked hierarchically, so too a microstructure on a base substrate can be stacked hierarchically.

The fact that these tail groups can be added or subtracted at will makes the construction of surface energy gradients at the molecular level a possibility. Mixed SAM surfaces can be created on a surface using two separate SAM surfactant solutions, an AFM tip for nanografting, and a flow controller with picoliter capability for liquid additions.

It should be appreciated that a basic construct for a surface energy gradient is the juxtaposition of hydrophilic and hydrophobic domains. The fine-scale control of surface energy gradients depends on what size scale these domains can be alternated or juxtaposed.

It should be appreciated that the resulting surface energy gradient allows for self-arrangement of water into structured and unstructured domains of water or components of aqueous fluids into domains of polar and nonpolar liquids.

An organic or oil-bearing fluid could be propelled in a similar manner by starting with a high-energy surface (such as —COOH) and decreasing the surface energy along the length of the surface or channel using low-energy groups (such as —CH3).

For example, if a drop of water is placed at the beginning of a channel treated with a methyl surface, the water drop will not wet the channel because of the low-energy methyl surface. However, it is attracted to the slightly higher energy surface composed of a mixed methyl and —CO2H surface. As the CO2H concentration of the surface increases, the force of attraction between the water and the surface increases. The contact angle between the advancing drop and the mixed-SAM surface decreases along the length of the channel. Therefore, the drop can propel itself across the surface without the use of any external forces.

By changing the surfactant additions so that a surface is created with a surface energy gradient from high-surface energy to low-surface energy, the design would allow for a low-energy nonpolar molecule such as a drop of oil to propel itself across the surface. The design could also be used for systems where one merely wishes to reduce the external energy required to translate a microstructure surface across a target surface with a liquid interface.

Disclosed are fast blooming surfactants that are suitable for inclusion in microstructured surface embodiments that will subsequently be treated with a low surface energy material to create a surface energy gradient between the underlying polymeric structure of the film and spaced apart microscopic depositions of the low surface energy material.

In some embodiments, the surfactants may have a permeation rate of less than 1000 hours, a surface tension in an aqueous solution at a concentration that may be greater than the critical micelle concentration that lies between the critical surface tension of the underlying microstructured surface and the critical surface tension of a low hierarchical level where surface energy depositions are made; and an HLB (hydrophilic/lipophilic balance) between about 6 and about 16. Some surfactants may have a hydrophobic chain that is substantially saturated.

Exemplary Embodiments

The following examples are specific embodiments directed to the design of super-slippery and super-adhesive microstructured surfaces, called extremal microstructured surfaces. These embodiments are not meant to be exhaustive, but rather examples to guide one in the practice of this patent. It will be understood that each embodiment may be desired alone or in combination with another embodiment to produce yet still a further embodiment.

Figure 4:
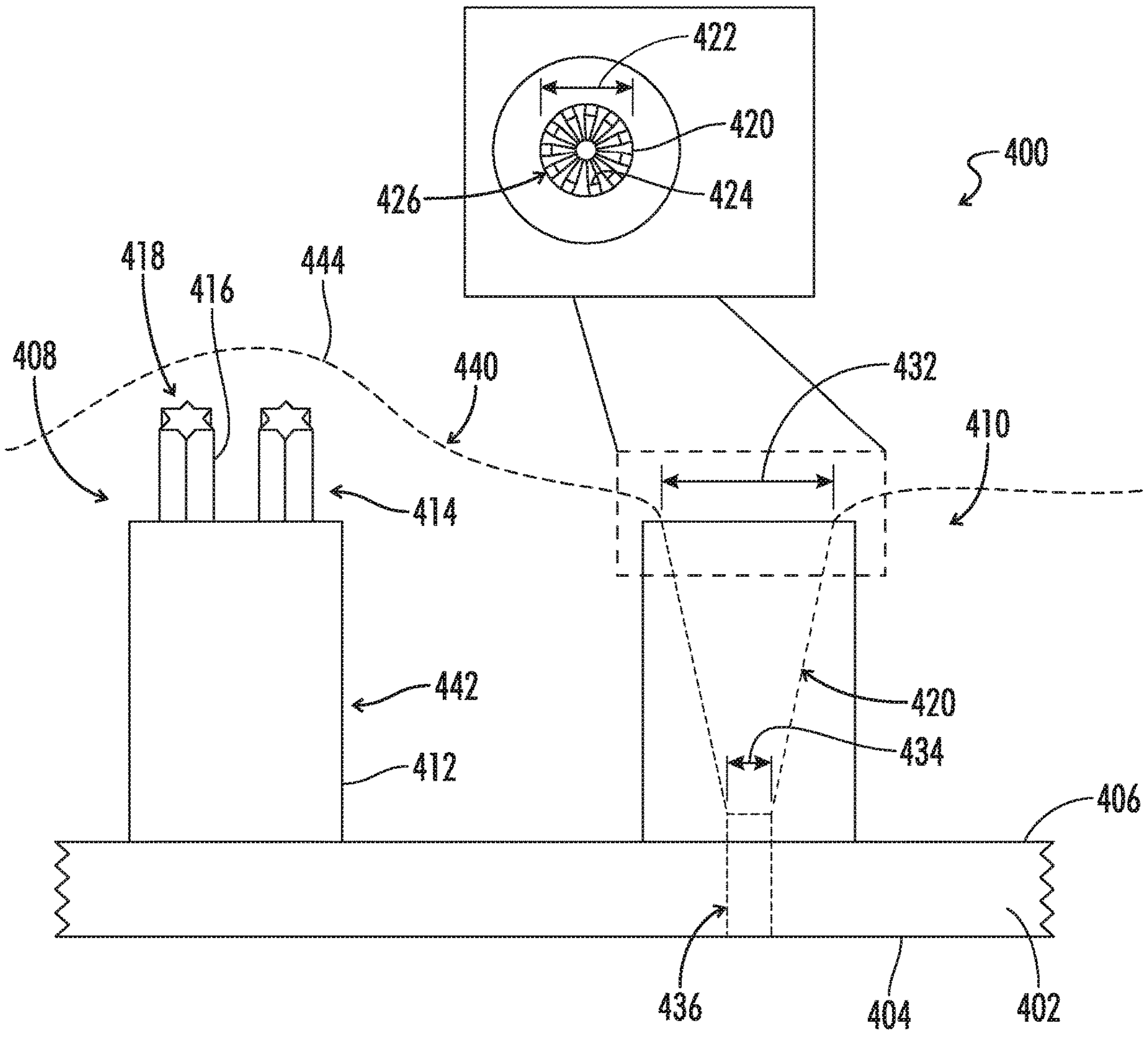
FIG. 4 is an embodiment of a super-slippery microstructured surface utilizing water-layer trapping and recirculant surfactant delivery.

Example 1. Super-Slippery Microstructured Surface Utilizing Water-Layer Trapping and Recirculant Surfactant Delivery Referring to FIG. 4, there is an exemplary embodiment of microstructured surface 400, which may include a substrate 402 with flat side 404 and microstructured side 406. Microstructured side 406 is comprised of complex-pillars 408 and capillary pillars 410. Complex-pillars 408 comprise first hierarchical level pillars 412 and second hierarchical pillars 414. Second hierarchical pillars 414 are distinct from first hierarchical pillars 412 in that the second hierarchical pillars have disposed on their vertical surface radially oriented fins 416 with triangular cross section 418. Capillary pillars 410 may be comprised of taper hole 420 with circular cross section 422 anchoring center directed fins 424 of rectangular cross section 426. Fins 424 may be spaced circumferentially with a first distance at the proximal end of capillary pillar 410 and spaced with a second distance at the distal end of capillary pillar 410. Spacing between the fins 424 at the proximal end may be larger than spacing at the distal end. The reason for this is that taper hole 420 may have diameter 432 at the proximal end and diameter 434 at the distal end, where diameter 432 is greater than diameter 434. Accordingly, the internal surface taper hole 420 may define a surface gradient which may increase from proximal end to distal end. Also disposed in substrate 402 corresponding with capillary pillar 410 may be through holes 436. The space between the capillary fins 424 may be filled with a solid, dissolvable surfactant.

The action of microstructured device 400 may comprise a Wenzel-Cassie anchoring effect created by complex-pillars 408. When device 400 is exposed to a wet target, the solid, dissolvable surfactant may dissolve and affect the composition of the liquid in the interfacial volume. The surfactant may create a Wenzel-Cassie zone around complex pillars 408 comprising a surfactant rich region 440 surrounding second pillars 414 and a surfactant depleted region 442 surrounding first pillars 412. These two regions resist mixture anchoring a layer of water 444 to microstructured device 400. The anchoring of water layer 444 to microstructured device 400 is maintained by replacement of the surfactant in water layer 444 that has been lost by diffusion. The mechanism of surfactant replacement comprises water layer 444 entering taper hole 420 by the energy gradient which drives water 444 to the distal end of taper hole 420. During the transport of water layer 444, solid, dissolvable surfactant dissolves into the water layer. Surfactant rich water may exit through hole 436. The mechanism of surfactant replacement establishes an energy gradient outside capillary pillars 410 between exterior proximal surface and distal surfaces, thus anchoring water layer 444.

Figure 5:
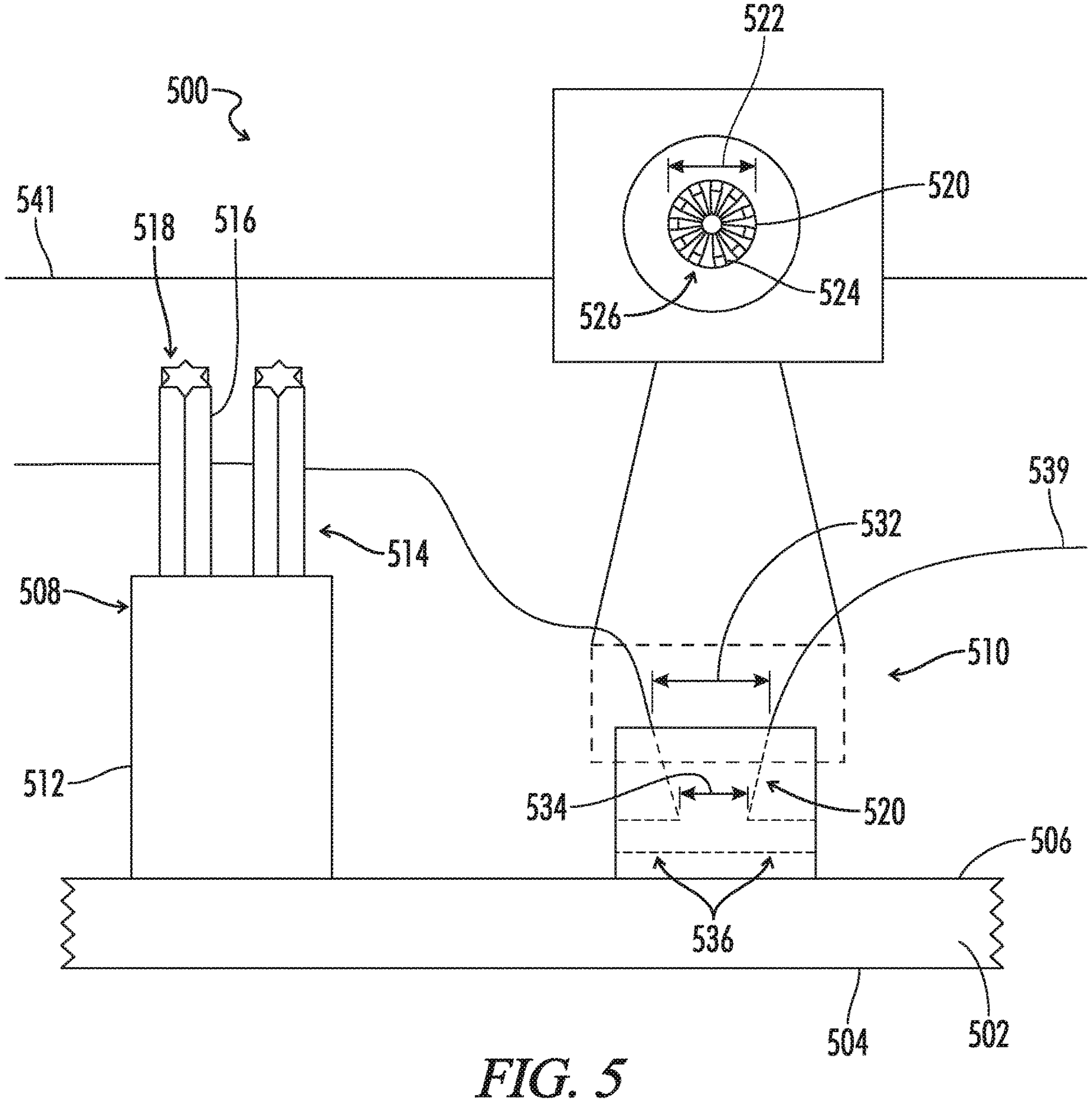
FIG. 5 is an embodiment of a super-adhesive microstructured surface utilizing capillary action and surfactant enhanced Wenzel-Cassie domain formation.

Example 2. Super-Adhesive Microstructured Surface Utilizing Capillary Action and Surfactant Enhanced Wenzel-Cassie Domain Formation Referring to FIG. 5, there is an exemplary embodiment of microstructured surface 500, which may include a substrate 502 with flat side 504 and microstructured side 506. Microstructured side 506 may be comprised of complex-pillars 508 and capillary pillars 510. Complex-pillars 508 may be taller than capillary pillars 510. Complex-pillars 508 may include first hierarchical level pillars 512 and second hierarchical pillars 514. Second hierarchical pillars 514 may be distinct from first hierarchical pillars 512 in that pillars 514 have disposed on their vertical surface radially oriented fins 516 with triangular cross section 518. Capillary pillars 510 may be comprised of taper hole 520 with circular cross section 522 anchoring center directed fins 524 of rectangular cross section 526. Fins 524 may be spaced circumferentially with a first distance at the proximal end of capillary pillar 510 and spaced with a second distance at the distal end of capillary pillar 510. Spacing between the fins 524 at the proximal end may be larger than spacing at the distal end. The reason for this is that taper hole 520 may have diameter 532 at the proximal end and diameter 534 at the distal end, where diameter 532 is greater than diameter 534. Accordingly, the internal surface taper hole 520 may define a surface gradient which may increase from proximal end to distal end. Also disposed on capillary pillar 510 are through holes 536. In one embodiment, through holes 536 may communicate with base flat surface 504. The space between the capillary fins 524 may be filled with a solid, dissolvable surfactant.

The action of microstructured device 500 comprises a Wenzel-Cassie anchoring effect created by complex-pillars 508. When device 500 is exposed to a wet target surface, the solid, dissolvable surfactant draws liquid 539 into capillary pillars 510. This action causes device 500 to be drawn to target surface 541 and to cause complex-pillars 508 to contact target surface 541 and form a Wenzel-Cassie anchor with the target surface 541. The anchoring of target surface 541 to microstructured device 500 may be maintained by the pumping action of capillary pillars 510, which deplete the water between microstructured device 500 and target surface 541 by the same action as described in Example 1, except the outflow of water from capillary pillars 510 does not create a re-entrant flow, but rather expels water to the exterior of capillary pillar 510. It will be understood that the through holes 536 may communicate with the exterior at various points, including, but not limited to the flat side 504 and/or microstructured side 506.

Figure 6:
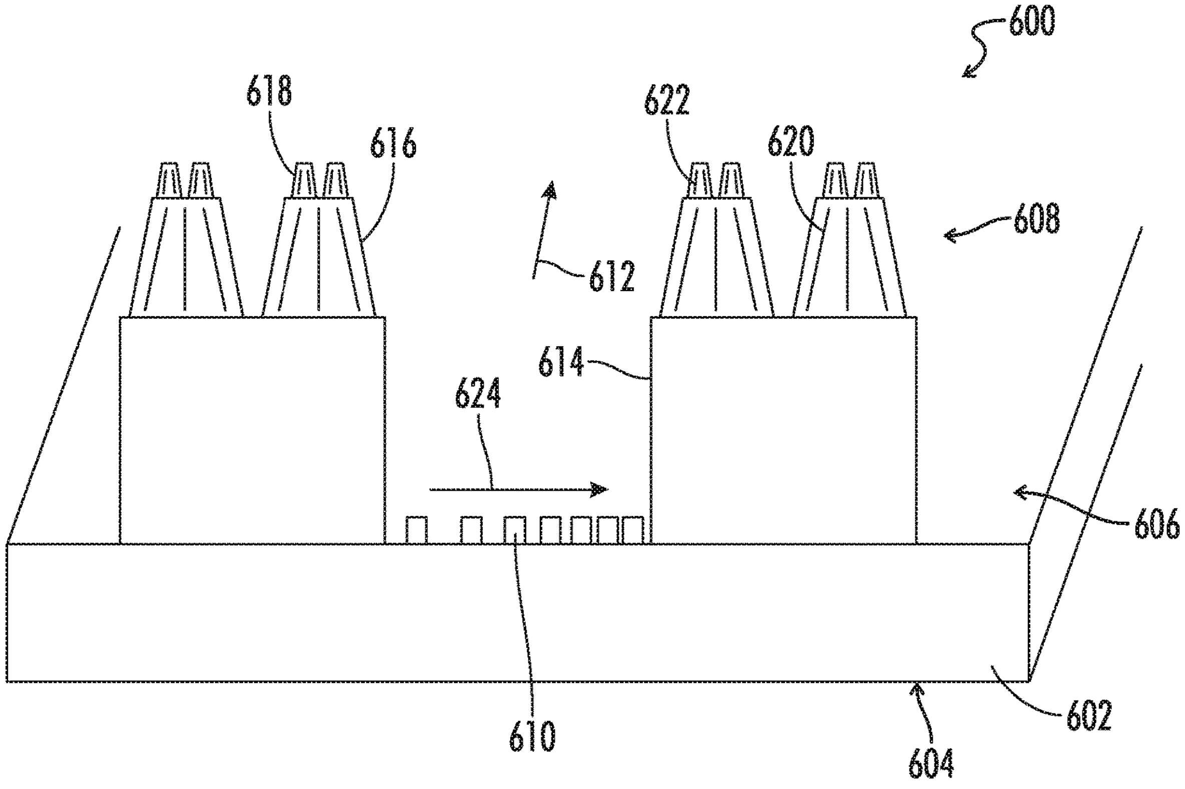
FIG. 6 is an embodiment of a super-slippery microstructured surface utilizing energy gradient micro-rails and particulate excluding microstructure water domains.

Example 3. Super-Slippery Microstructured Surface Utilizing Energy Gradient Micro-Rails and Particulate Excluding Microstructured Water Domains Referring to FIG. 6, there is an exemplary embodiment of microstructured surface 600, which may include a substrate 602 with flat side 604 and microstructured side 606. Microstructured side 606 may be comprised of complex-pillars 608 and micro-rails 610. Microstructured device 600 has a preferred slippage direction 612. A first water repulsive aspect comprises complex-pillars 608. Complex-pillars 608 may include first hierarchical level pillars 614, second hierarchical level pillars 616, and third hierarchical level pillars 618. First pillars 614 may be smooth walled. Second 616 and third pillars 618 may have walls exposed with second pillar fins 620 and third pillar fins 622. Second pillars 616 and third pillars 618 may be tapered from distal end to proximal end. Second 620 and third pillar fins 622 may be further apart at the distal end and closer together at proximal end of second 616 and third pillars 618. An increasing surface energy gradient may be created from distal to proximal ends spanning second 616 and third pillars 618.

A second water transport aspect comprises micro-rails 610. Micro-rails 610 may be parallel convergent in the direction opposite slippage direction 612 creating an increasing surface energy gradient opposite to slippage direction 612. Micro-rails 610 may have a variety of cross sections, with or without side fins aligned in the direction of the slippage direction 612.

The action of microstructured device 600 may include a water repulsive aspect comprising first hierarchical level pillars 614 which trap air bubbles 624. Second 616 and third hierarchical level pillars 618 may form a water repulsive transport structure wherein water flows from micro-rails 610 along path 620. Micro-rails 610 may form a water transport structure wherein water flows opposite to the slippage direction 612 along path 622. The combined effect of these microstructures may cause microstructured device 600 to slide in the direction 612 with minimal shear force in the direction 612.

Figure 7:
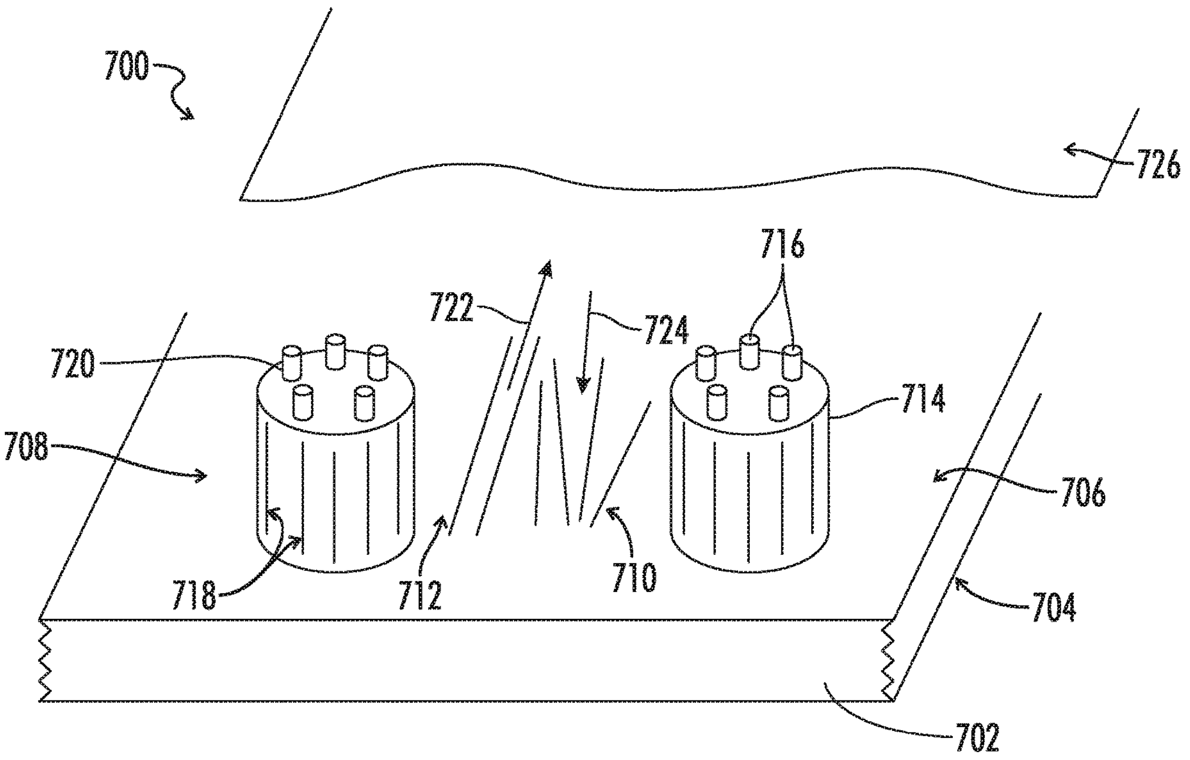
FIG. 7 is an embodiment of a super-adhesive microstructured surface utilizing opposing energy gradients and contact angle confusion.

Example 4. Super-Adhesive Microstructured Surface Utilizing Opposing Energy Gradients and Contact Angle Confusion Referring to FIG. 7, there is an exemplary embodiment of microstructured surface 700, which may include a substrate 702 with flat side 704 and microstructured side 706. Microstructured side 706 may be comprised of complex-pillars 708 and micro-rails 710 and 712. A first target surface anchoring aspect may include complex-pillars 708. Complex-pillars 708 may comprise first hierarchical level pillars 714 and second hierarchical level pillars 716. First pillars 714 may be disposed with parallel fins 718. Second pillars 716 may have smooth walls 720.

A second water transport aspect may include micro-rails 710 and 712. Micro-rails 710 and 712 may be parallel convergent in opposing directions 722 and 724 creating opposing increasing surface energy gradients. Micro-rails 710 and 712 may have a variety of cross sections, with or without side fins aligned in the directions 722 and 724.

The action of microstructured device 700 may include a tissue anchoring aspect comprising first hierarchical level pillars 714 which traps target surface 726. Second hierarchical level pillars 716 may form a Wenzel-Cassie anchor with pillars 714. Micro-rails 710 and 712 may form a water transport structure wherein water flows in directions 722 and 724, removing water between microstructured device 700 and target surface 726. The combined effect of these microstructures may cause microstructured device 700 to anchor to target surface 726.

Figure 8:
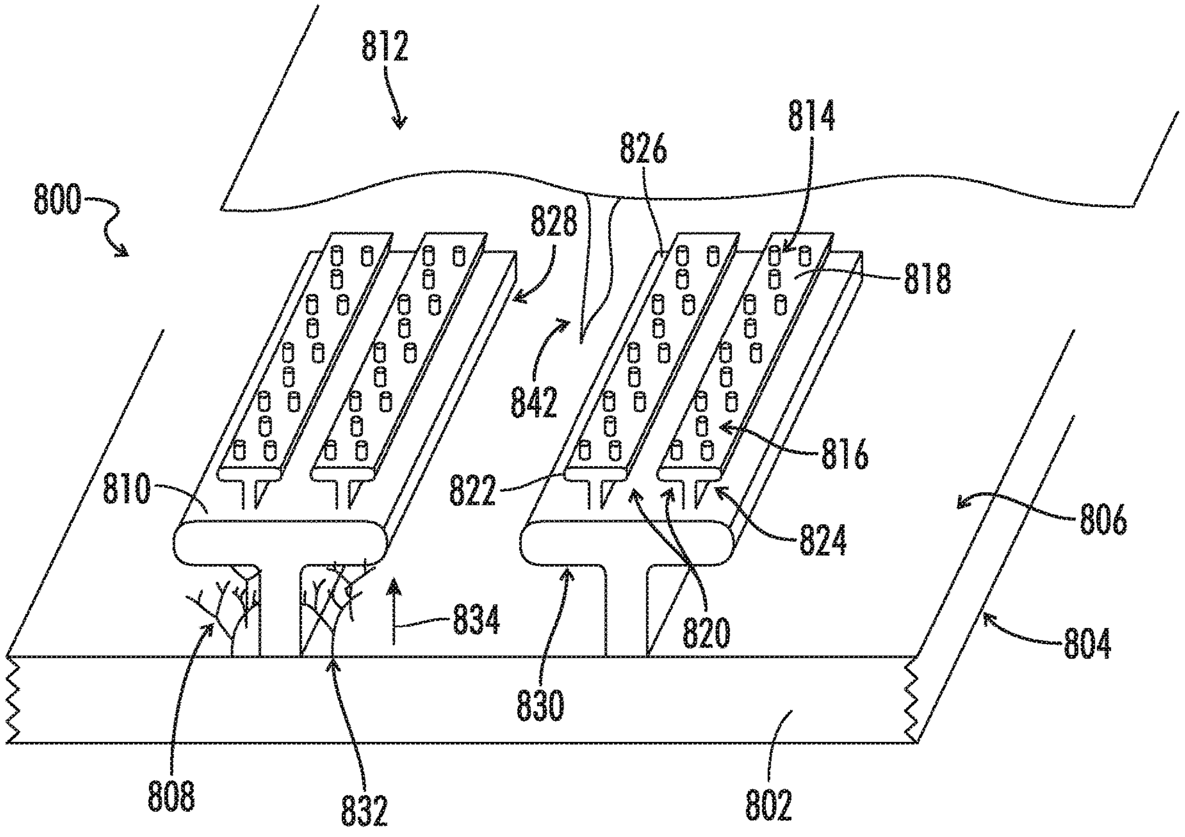
FIG. 8 is an embodiment of a super-slippery microstructured surface utilizing air bubble entrapment on energy gradient micro-rails.

Example 5. Super-Slippery Microstructured Surface Utilizing Air Bubble Entrapment on Energy Gradient Micro-Rails Referring to FIG. 8, there is an exemplary embodiment of microstructured surface 800, which may include a substrate 802 with flat side 804 and microstructured side 806. Microstructured side 806 may be comprised of hierarchical micro-rails 808. The hierarchical micro-rails 808 may be comprised of a basic T structure, where side 810 may be proximal to the target surface 812. The first hierarchical level 814 may be comprised of cylinders 816 arranged on the top 818 of the second hierarchical level 820 comprised of T-shaped micro-rails 822. Sides 824 of micro-rails 822 may be also populated with first hierarchical cylinders 816. Second hierarchical level micro-rails 822 may be arranged on the top 826 of third hierarchical level 828 comprised of T-shaped micro-rails 830. The sides of micro-rails 830 may be populated with bifurcating fins 832. The fins 832 may bifurcate in a uniform direction. The density of fins may also double at each bifurcation. Consequently, surface energy may increase in direction 834 corresponding with increased bifurcation and density.

The mechanism of microstructure device 800 may include first hierarchical level 814 comprised of cylinders 816 which may trap air bubbles and create in aggregate a near uniformly distributed layer of entrapped bubbles. This air bubble layer may essentially contact the target surface 812. Discontinuity 842 in target surface 812 may pass between microstructure device 800 and target surface 812 without causing a kinetic energy absorbing vertical displacement of device 800. First hierarchical micro-rail fins 832 generate a fluid transport aspect that provides for super-slippery shear translation of microstructure device 800 with respect to target surface 812 in direction 834.

Figure 9:
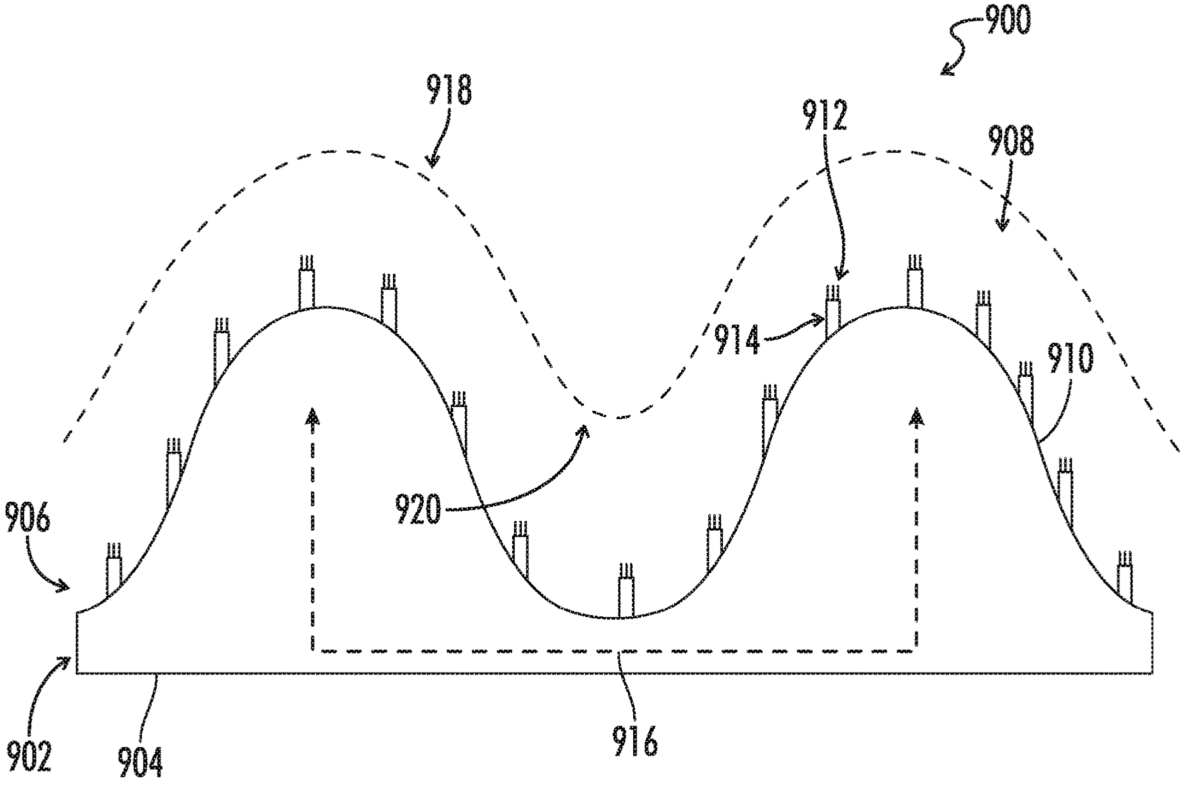
FIG. 9 is an embodiment of a super-adhesive microstructured surface utilizing Wenzel-Cassie anchoring and Schallamach wave entrapment.

Example 6. Super-Adhesive Microstructured Surface Utilizing Wenzel-Cassie Anchoring and Schallamach Wave Entrapment Referring to FIG. 9, there is an exemplary embodiment of microstructured surface 900, which may include a substrate 902 with flat side 904 and microstructured side 906. Microstructured side 906 may be comprised of complex-pillars 908 arranged on a sinusoidal background 910. The first hierarchical level may be comprised of finned pillars 912 arranged on a second hierarchical level smooth pillar 914. The second pillars 914 may be equally spaced on the sinusoidal background 910.

The complex-pillars 908 may generate target layer Wenzel-Cassie interface adhesion. The target layer may be known and its associated spectrum of eigen modes of Schallamach waves. The distance between sinusoidal peaks 916 may be designed to match the wavelength of the first eigenmode of the target layer Schallamach wave spectrum. A displacement of the device 900 with respect to the target surface may generate the first Schallamach wave 918 which becomes entrained in sinusoidal background 910 in region 920. Once the wave 918 fills region 920 then slippage of device 900 with respect to the target surface may stop. A much larger force may now be required to disrupt this trapped Schallamach wave state.

Figure 10:
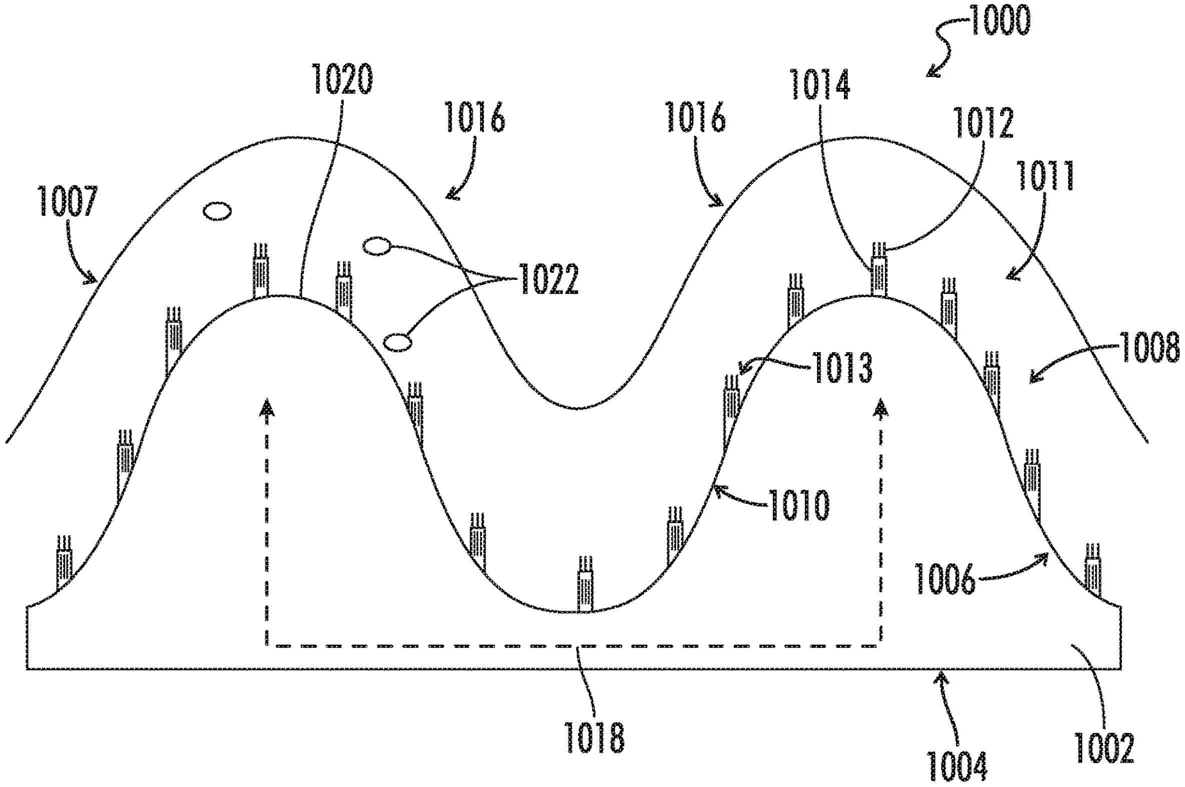
FIG. 10 is an embodiment of a super-slippery microstructured surface utilizing Wenzel-Cassie water layer entrapment and half-wave wave transmission.

Example 7. Super-Slippery Microstructured Surface Utilizing Wenzel-Cassie Water Layer Entrapment and Half-Wave Wave Transmission Referring to FIG. 10, there is an exemplary embodiment of microstructured surface 1000, which may include a substrate 1002 with flat side 1004 and microstructured side 1006 in contact with target surface 1007. Microstructured side 1006 may be comprised of complex-pillars 1008 arranged on a sinusoidal background 1010. The first hierarchical level 1011 may be comprised of smooth pillars 1012 arranged on a second hierarchical level 1013 composed of finned pillar 1014. The second pillars 1014 may be equally spaced on the sinusoidal background 1010.

The complex-pillars 1008 may generate bubble entrapment. The target layer 1007 may be living tissue with a characteristic and regular peristaltic wave 1016. The distance between sinusoidal peaks 1018 may be designed to be one half the wavelength of the peristaltic wave 1016, such that the sinusoidal peaks 1020 block entrapment of the peristaltic waves 1016. In a sense, device 1000 may skip off the peristaltic waves 1016 of the target surface 1007. The trapped bubbles 1022 of first hierarchical level 1011 may act as both a lubricious surface and shock absorber, minimizing energy absorbing vertical displaces which the periodicity 1018 prevents peristaltic wave 1016 trapping.

Example 8. Super-Adhesive Microstructured Surface Utilizing the Microstructure of the Target Surface to Create a Microstructure Interface Volume Referring to FIG. 11, there is an exemplary embodiment of microstructured surface 1100, which may include a substrate 1102 with flat side 1104 and microstructured side 1106. Microstructured side 1106 may be comprised of complex-pillars 1108 arranged on the sides of micro rails 1110. The first hierarchical level may be comprised of finned pillars 1112 arranged on a second hierarchical level smooth pillar 1114. The third hierarchical layer may be comprised of microstructures 1110 residing on 1106 and microstructures 1116 residing on target surface 1118. The third layer microstructures 1110 may be complementary to microstructures 1116 in the sense they approximate mirror images of each other about the plane of contact. The microstructures 1116 on the target surface 1118 may be approximately oriented randomly, and so the micro-rails 1110 residing on surface 1106 are also approximately oriented randomly. At least some of the micro-rails 1110 may be adjacent to microstructures 1116 and may be adjacent to each other.

Figure 11:
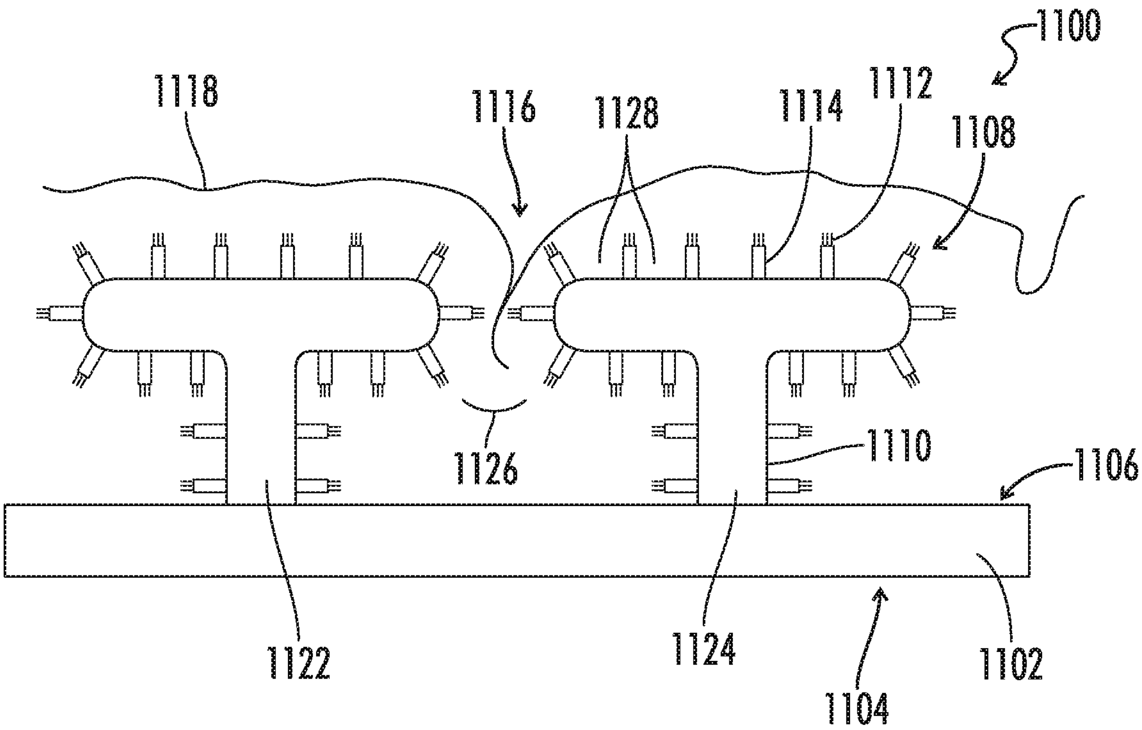
FIG. 11 is an embodiment of a super-adhesive microstructured surface utilizing the microstructure of the target surface to create a microstructure interface volume.

As illustrated in FIG. 11, pillars 1114 may be arranged on the sides of micro-rails 1110 and the micro-rails 1110 may be arranged in pairs 1122 and 1124 which may be spaced by design to provide for arrangement 1126 where Wenzel-Cassie anchoring zones 1128 anchor a target surface microstructure 1116 to create an anchoring microstructure comprising both the microstructured device 1100 and the target surface 1118.

Thus, although there have been described particular embodiments of the present disclosure of a new and useful Extremal Microstructured Surfaces it is not intended that such references be construed as limitations upon the scope of this disclosure except as set forth in the following claims.

What is claimed is:

1. A device having a microstructure surface comprising:

a first surface having at least a first distinct region and a second distinct region disposed about the surface, the first distinct region comprising a first microstructure having a first surface energy, the second distinct region comprising a second microstructure having a second surface energy;

the first and second distinct regions configured to contact a liquid disposed on a target surface, such that upon contact at least one interface region between at least the first surface or second surface and the target surface is formed and at least one spatially varying energy gradient develops in the interface region; and the at least one interface region includes at least two regions selected from the group comprising: i) a Wenzel-Cassie region; ii) a Schallamach trapping region; iii) a contact angle confusion region; and iv) an anchoring region.

2. The device of claim 1, wherein the anchoring region is developed by at least one anchoring mechanism selected from the group comprising: i) capillary action; ii) Wenzel-Cassie formation; and iii) a surfactant-generated surface energy gradient.

3. The device of claim 2 wherein the anchoring region is developed from opposing two of the anchoring mechanisms selected from the group comprising: i) capillary action; ii) Wenzel-Cassie formation; and iii) a surfactant-generated surface energy gradient.

4. The device of claim 1 wherein the first microstructure comprises a plurality of hierarchical pillars and the second microstructure comprises a plurality of capillary pillars, each pillar of the plurality of hierarchical pillars including a first pillar and a second pillar wherein the second pillars are disposed about the first pillars and the second pillars include a surface with vertically oriented radial fins, each pillar of the plurality of capillary pillars including a vertically tapered hole disposed about the central cross-section of the pillar wherein the hole has a circular cross-section, the cross-section being larger at the top of the hole than the bottom, the vertically tapered hole including vertically oriented radial fins defining an interior surface of the hole which develops a surface energy gradient that increases from the top of the hole to the bottom of the hole.

5. The device of claim 4 wherein at least one of the plurality of the capillary pillars includes a through-hole communicated with the vertically tapered hole.

6. The device of claim 1 wherein the first microstructure comprises a plurality of hierarchical pillars and the second microstructure comprises a plurality of micro rails, each pillar of the plurality of hierarchical pillars including a first pillar, a second pillar, and a third pillar wherein the second pillars are disposed about the first pillars and the third pillars are disposed about the second pillars, the second and third pillars being tapered with a larger circumference at the base of the pillar and a smaller circumference at the top of the pillar, the second and third pillar including a surface with vertically oriented radial fins, the plurality of micro rails being parallel to each other but having a decreasing distance between each successive micro rail in the direction opposite of a slippage direction of the device.

7. The device of claim 1 wherein the first microstructure comprises a plurality of hierarchical pillars and the second microstructure comprises a plurality of micro rails, each pillar of the plurality of hierarchical pillars including a first pillar and a second pillar wherein the second pillars are disposed about the first pillars and the first pillars include a surface with vertically oriented radial fins, the plurality of micro rails are convergent in opposing directions.

8. The device of claim 1 wherein the first microstructure comprises a plurality of hierarchical micro rails and pillars including a first micro rail, a second micro rail disposed about the first micro rail, and a pillar disposed about the second micro rail, the first micro rail further including a surface with bifurcating fins.

9. The device of claim 1 wherein the first microstructure comprises a plurality of hierarchical pillars disposed about a sinusoidal surface, each pillar of the hierarchical pillars including a first pillar disposed about the second pillar, the second pillar being equally spaced apart on the sinusoidal surface and the first pillar including vertically-oriented radial fins.

10. The device of claim 1 wherein the first microstructure comprises a plurality of hierarchical pillars disposed about a sinusoidal surface, each pillar of the hierarchical pillars including a second pillar with vertically-oriented radial fins, and a first pillar disposed about the second pillar, the second pillar being equally spaced apart on the sinusoidal surface and wherein the sinusoidal surface is configured such that the distance between the sinusoidal peaks is one half the wavelength of a peristaltic wave of the target layer.

11. The device of claim 1 wherein the first microstructure comprises a plurality of hierarchical micro rails and pillars including a first micro rail, a plurality of hierarchical pillars disposed about the first micro rail, the plurality of hierarchical pillars including a first pillar having vertically-oriented radial fins, the first pillar disposed about a second pillar, the target surface also includes a plurality of micro rails which are configured to be complementary to the first microstructures.

* * * * *